United States Patent
Patra

(10) Patent No.: US 9,851,641 B2
(45) Date of Patent: Dec. 26, 2017

(54) ILLUMINATION SYSTEM FOR AN EUV PROJECTION LITHOGRAPHIC PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 146 days.

(21) Appl. No.: 14/594,466

(22) Filed: Jan. 12, 2015

(65) Prior Publication Data

US 2015/0124233 A1 May 7, 2015

Related U.S. Application Data

(63) Continuation of application No. PCT/EP2013/066290, filed on Aug. 2, 2013.
(Continued)

(30) Foreign Application Priority Data

Aug. 8, 2012 (DE) ........................ 10 2012 214 063

(51) Int. Cl.
*G03F 7/20* (2006.01)
*G21K 1/06* (2006.01)
(Continued)

(52) U.S. Cl.
CPC .......... *G03F 7/70058* (2013.01); *B82Y 10/00* (2013.01); *G03F 7/70008* (2013.01);
(Continued)

(58) Field of Classification Search
None
See application file for complete search history.

(56) References Cited

U.S. PATENT DOCUMENTS 5,896,438 A 4/1999 Miyake et al.
6,498,351 B1 12/2002 Kruizinga et al.
(Continued)

FOREIGN PATENT DOCUMENTS

DE 103 58 255 B3 6/2005
DE 10358225 B3 * 6/2005 ............... H05H 7/04
(Continued)

OTHER PUBLICATIONS

New Era of Research Begins as World's First Hard X-ray Laser Achieves "First Light", Apr. 21, 2009, http://home.slac.stanford.edu/pressreleases/2009/20090421.htm.*
(Continued)

*Primary Examiner* — Steven H Whitesell Gordon
(74) *Attorney, Agent, or Firm* — Fish & Richardson P.C.

(57) ABSTRACT

An illumination system for an EUV projection lithographic projection exposure apparatus comprises an EUV light source, which generates an output beam of EUV illumination light with a predetermined polarization state. An illumination optical unit guides the output beam along an optical axis, as a result of which an illumination field in a reticle plane is illuminated by the output beam. The light source comprises an electron beam supply device, an EUV generating device and a polarization setting device. The EUV generating device is supplied with an electron beam by the electron beam supply device. The polarization setting device exerts an adjustable deflecting effect on the electron beam for setting the polarization of the output beam. This results in an illumination system, which operates on the basis of an electron beam-based EUV light source and provides an output beam, which is improved for a resolution-optimized illumination.

13 Claims, 5 Drawing Sheets

Related U.S. Application Data

Figure 1:
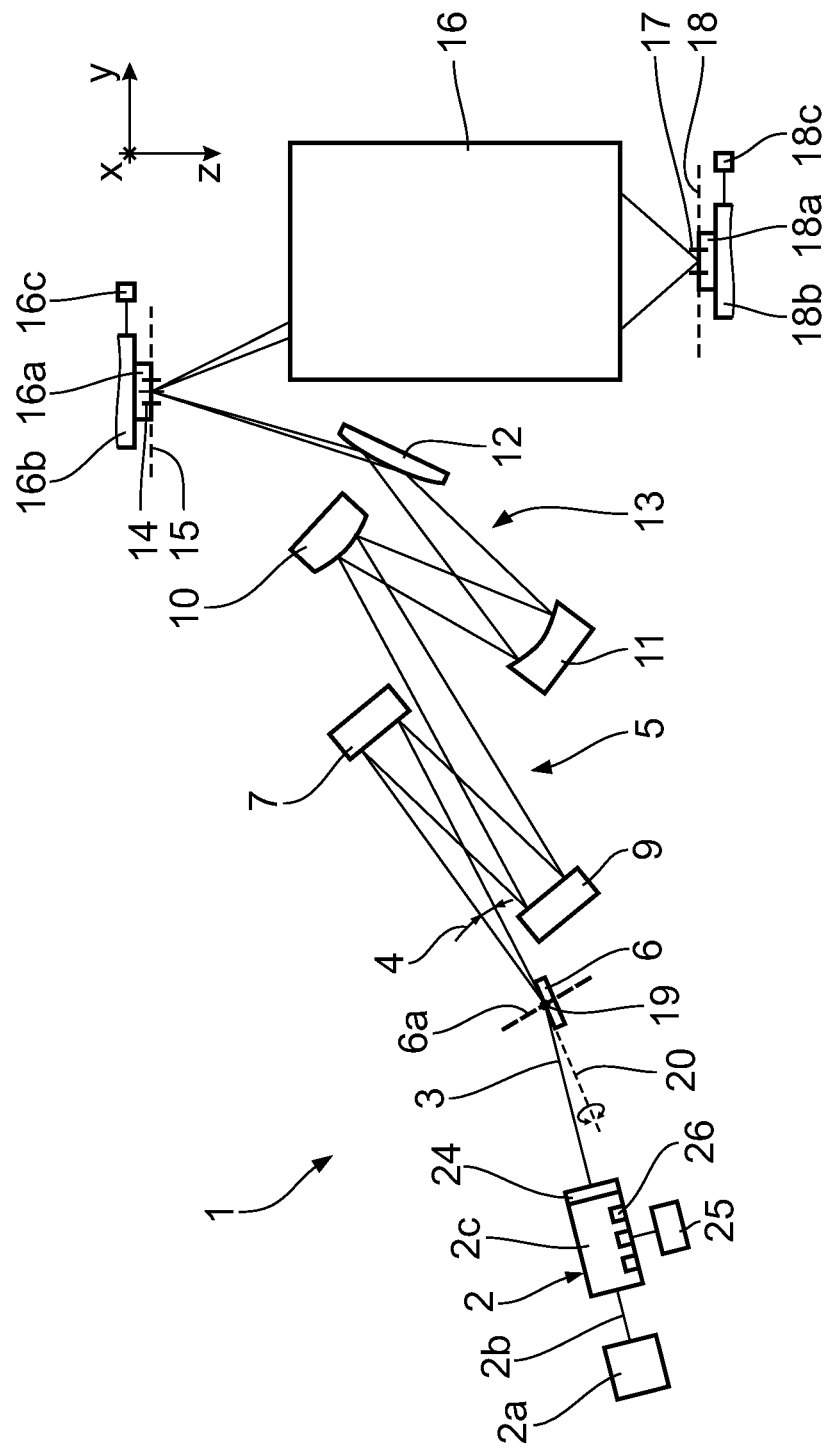

(60) Provisional application No. 61/680,754, filed on Aug. 8, 2012.

(51) Int. Cl.
  *B82Y 10/00* (2011.01)
  *H01S 3/09* (2006.01)
  *H05G 2/00* (2006.01)

(52) U.S. Cl.
  CPC ...... *G03F 7/70025* (2013.01); *G03F 7/70075* (2013.01); *G03F 7/70116* (2013.01); *G03F 7/70566* (2013.01); *G21K 1/062* (2013.01); *G21K 1/067* (2013.01); *H01S 3/0903* (2013.01); *H05G 2/00* (2013.01)

(56) References Cited

U.S. PATENT DOCUMENTS

| | | | |
|---|---|---|---|
| 2003/0043356 A1 | 3/2003 | Shiraishi | |
| 2003/0043359 A1 | 3/2003 | Naulleau | |
| 2005/0175042 A1 | 8/2005 | Hajima | |
| 2006/0158288 A1* | 7/2006 | Rossmanith | H05H 7/04 335/216 |
| 2007/0152171 A1 | 7/2007 | Goldstein et al. | |
| 2009/0213356 A1* | 8/2009 | Gruner | B82Y 10/00 355/71 |
| 2010/0045410 A1 | 2/2010 | Beckenbach et al. | |
| 2011/0014799 A1* | 1/2011 | Dinger | G03F 7/70008 438/795 |

FOREIGN PATENT DOCUMENTS

| | | |
|---|---|---|
| DE | 10 2006 039 655 A1 | 3/2008 |
| DE | 10 2006 056 052 A1 | 5/2008 |
| JP | 2005-228489 A | 8/2005 |
| JP | 2007-514285 A | 5/2007 |
| JP | 2010-502003 A | 1/2010 |
| JP | 2011-517072 A | 5/2011 |
| WO | WO 2009/121438 A | 10/2009 |

OTHER PUBLICATIONS

Neil et al., "Technical approaches for high-average-power free-electron lasers," Jul. 2002, Reviews of Modern Physics, vol. 74, pp. 685-701.*
The Chinese Office Action and Search Report, with translation thereof, for corresponding CN Appl No. 201380042232.7, dated Mar. 4, 2016.
Kostka, B. et al., "Superconductive undulators with variable polarization direction", Proceedings of APAC 2004, Korea, pp. 221-223.
Uwe Schindler "Ein supraleitender Undulator mit elektrisch umschaltbarer Helizität" [A superconducting undulator with electrically switchable helicity], Forschungszentrum Karlsruhe in der Helmholtz-Gemeinschaft, wissenschaftliche Berichte, FZKA 6997, Aug. 2004, with English Abstract at p. iii.
International Search Report for corresponding PCT Appl. No. PCT/EP2013/066290, dated Dec. 13, 2013.
German Examination Report, with translation thereof, for corresponding DE Appl No. 10 2012 214 063.8, dated Feb. 26, 2013.
The Chinese Office Action and English translation thereof for corresponding CN Appl. No. 201380042232.7, dated Jan. 16, 2017, 13 pages.
Japanese office action, with English translation thereof, for corresponding Appl No. 2015-525839, dated 12, 2017.

* cited by examiner

ILLUMINATION SYSTEM FOR AN EUV PROJECTION LITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2013/066290, filed Aug. 2, 2013, which claims benefit under 35 USC 119 of German Application No. DE 10 2012 214 063.8, filed Aug. 8, 2012. International application PCT/EP2013/066290 also claims priority under 35 USC 119(e) to U.S. Provisional Application No. 61/680,754, filed Aug. 8, 2012. The entire disclosure of international application PCT/EP2013/066290 and German patent application DE 10 2012 214 063.8 are incorporated herein by reference.

The invention relates to an illumination system for an EUV projection lithographic projection exposure apparatus. Furthermore, the invention relates to an operating method for such an illumination system, an optical system with such an illumination system, a projection exposure apparatus with such an optical system, a production method for a micro- and/or nanostructured component using such a projection exposure apparatus, and a micro- and/or nanostructured component produced by this method.

A projection exposure apparatus with an illumination system is known from WO 2009/121 438 A1. An EUV light source is known from DE 103 58 225 B3. Further citations, from which an EUV light source is known, are found in WO 2009/121 438 A1. EUV illumination optical units are furthermore known from US 2003/0043359 A1 and U.S. Pat. No. 5,896,438.

It is an object of the present invention to develop an illumination system, which operates on the basis of an electron beam-based EUV light source, in such a way that an output beam which is improved for a resolution-optimized illumination is provided.

According to the invention, this object is achieved by an illumination system for an EUV projection lithographic projection exposure apparatus
  comprising an EUV light source, which generates an output beam of EUV illumination light with a predetermined polarization state,
  comprising an illumination optical unit, which guides the output beam along an optical axis, as a result of which an illumination field in a reticle plane is illuminated by the output beam,
  wherein the EUV light source comprises the following:
    an electron beam supply device,
    an EUV generating device, which is supplied with an electron beam by the electron beam supply device,
    a polarization setting device, which exerts an adjustable deflecting effect on the electron beam for setting the polarization of the output beam.

According to the invention, it was identified that a polarization setting device, which exerts an adjustable deflecting effect on the electron beam for setting the polarization, leads to the option of a defined polarization prescription of the output beam. The polarization of the output beam can then be adapted to the respective polarization requirements during the object illumination by the illumination system.

Problems connected with conventional EUV radiation sources, for example with an LPP (laser produced plasma) light source or with a GDP (gas discharge produced plasma) light source, are avoided.

A polarization state of the output beam can be linearly polarized, elliptically polarized, circularly polarized or a mixture of these polarization forms. The polarization state can, in a manner predetermined by the polarization setting device, alternate between the polarization forms.

By way of example, an influencing effect of the polarization setting device on undulator deflection magnets, in which the EUV generating device is embodied as an undulator, wherein the polarization setting device is embodied in such a way that it influences an effect of deflection magnets of the undulator on the electron beam, can be brought about by displacing the deflection magnets for changing the magnet arrangement. The EUV light source can be embodied in the style of a synchrotron or in the style of a free electron laser (FEL).

A current flow control, in which the deflection magnets are embodied as electromagnets, wherein the polarization setting device controls a current intensity of a current flow through the electromagnets, avoids the necessity of displacing components. Thus, it is possible to bring about a polarization prescription without movable parts.

A scanning device for deflecting the output beam, operating in synchronized fashion with the polarization setting device, enables a particularly variable illumination. Advantages of such a scanning device are explained in detail in WO 2009/121 438 A1. A synchronization of the scanning device with the polarization setting device according to the invention leads to the option of a particularly flexible illumination adjustment.

An illumination system with an illumination optical unit, which comprises a field facet mirror with a plurality of field facets, and a pupil facet mirror with a plurality of pupil facets for prescribing an illumination angular distribution of an illumination of the illumination field by the output beam, wherein the output beam is guided along an illumination channel for prescribing an illumination angle over respectively one of the field facets and respectively one of the pupil facets, and wherein the scanning device for deflecting the output beam is arranged in front of the field facet mirror and the polarization setting device is embodied in such a way that the output beam polarization state is changed between impinging on a first field facet and, after an appropriate scanning deflection by the scanning device, impinging on a further field facet, employs the options of synchronizing the scanning device with the polarization setting device particularly well. Each of the field facets in turn can be made up of a plurality of individual mirrors. A change in a polarization state, particularly during scanning, can be brought about between neighboring field facets.

The advantages of a method for operating an illumination system according to the invention, comprising the following steps:
  setting a tilt angle association of the field facets of the field facet mirror and of the pupil facets of the pupil facet mirror in such a way that respectively one of the field facets of a group of field facets to be impinged upon by the output beam is respectively associated with one of the pupil facets via an illumination channel,
  wherein the scanning device, the polarization setting device and the tilt angle association are matched to one another in such a way that the output beam on each of the pupil facets has a predetermined polarization state,
correspond to those which were already explained above with reference to the illumination system according to the invention. Via the operating method, it is possible to prescribe, in particular, a polarization distribution of the output beam over the pupil facet mirror and hence a polarization distribution over the illumination angle.

If, in the case of a polarization prescription, in which the scanning device, the polarization setting device and the tilt angle association are matched to one another in such a way that the polarization state of the output beam on each of the pupil facets has a linear polarization component, which is perpendicular to a connecting line from the pupil facet to a center of an arrangement of the pupil facets on the pupil facet mirror, the linear polarization component perpendicular to the aforementioned connecting line is the only polarization component of the output beam, this can bring about a tangential polarization in which the polarization of the output beam illuminating an object is respectively perpendicular to a plane of incidence of the output beam. Alternatively, it is also possible to provide an elliptic polarization of which the larger polarization major axis is perpendicular to the connecting line.

A polarization lead included in the polarization state prescribed on the impinged upon pupil facets, which polarization lead takes account of subsequent influencing of the polarization along the path of the output beam after the pupil facet mirror, can, for example, compensate in advance the effects of a polarization change, in particular a polarization rotation, when guiding the output beam through the illumination optical unit between the pupil facet mirror and the illumination field.

Matching, which is brought about in such a way that a plurality of pupil facets, between which no difference in the polarization state is prescribed, are impinged upon in sequence on the pupil facet mirror, can reduce the number of necessary switching processes by the polarization setting device.

The advantages of an optical system
  comprising an illumination system according to the invention,
  comprising a projection optical unit for imaging the illumination field into an image field,
an EUV lithographic projection exposure apparatus
  comprising an optical system according to the invention,
  comprising a reticle holder for holding, in the reticle plane, a reticle to be impinged upon with illumination light of the optical system,
  comprising a projection optical unit for imaging the illumination field into an image field in an image plane,
  comprising a wafer holder for holding, in the image plane, a wafer in such a way that reticle structures arranged in the illumination field during a projection exposure are imaged onto a wafer section arranged in the image field,
a method for producing a structured component, comprising the following method steps:
  providing a reticle and a wafer,
  projecting a structure on the reticle onto a light-sensitive layer of the wafer with the aid of the projection exposure apparatus according to the invention,
  operating the illumination system according to the invention during the projection,
  generating a micro- and/or nanostructure on the wafer
and a micro- and/or nanostructured component produced according to the method according to the invention correspond to those which were already explained above with reference to the illumination system according to the invention.

Figure 2:
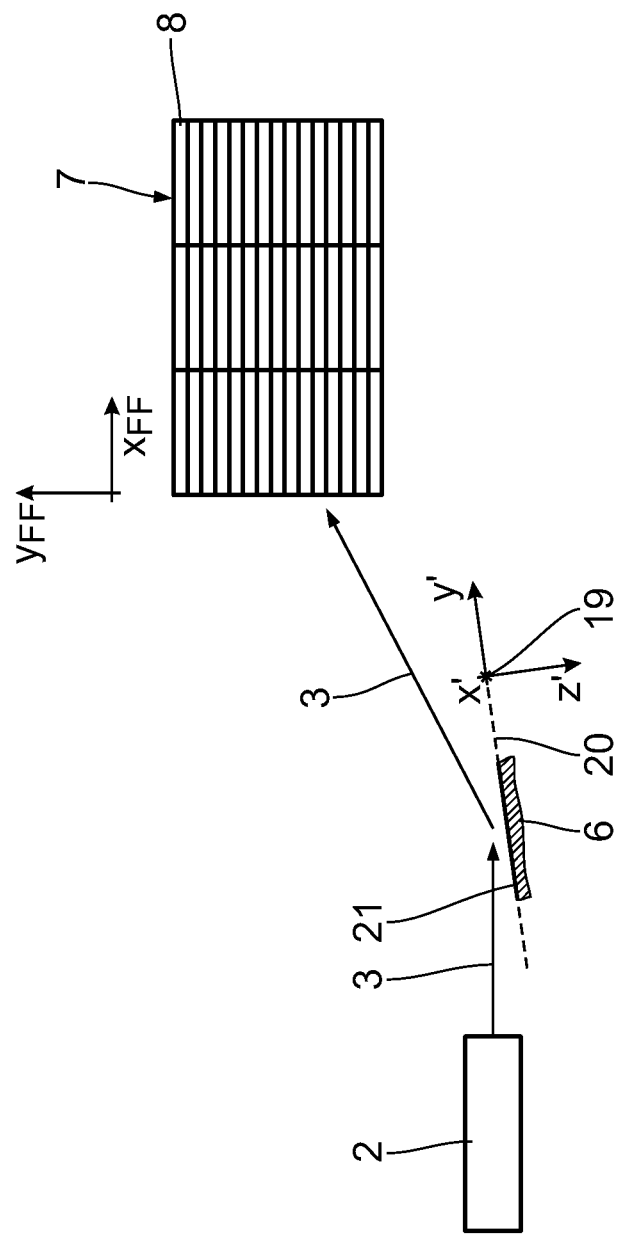
Figure 3:
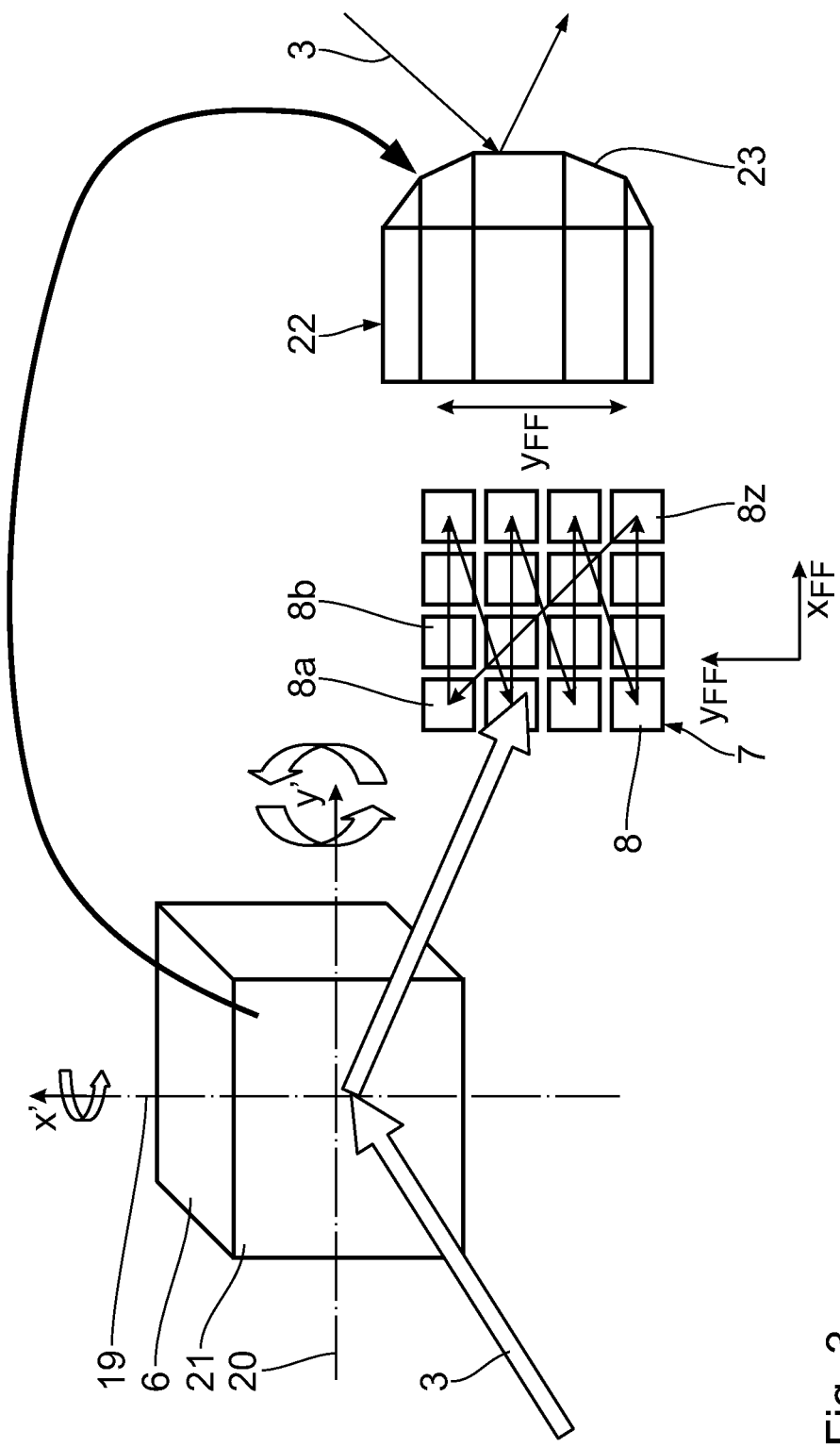
Figure 4:
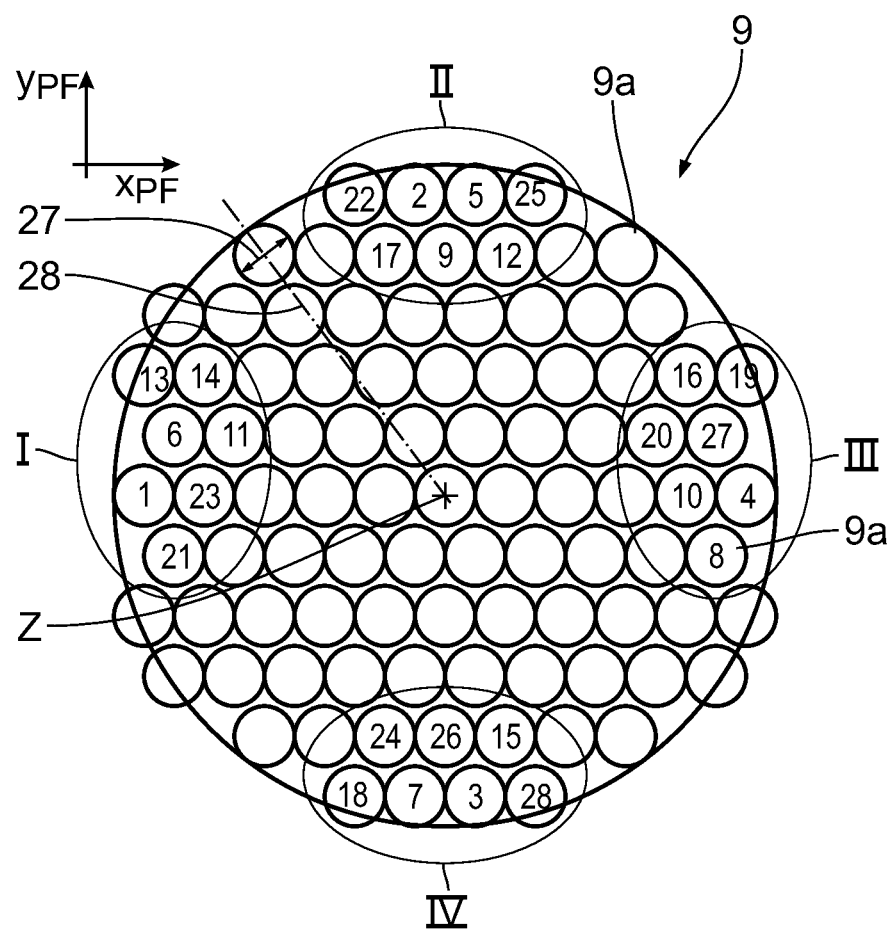
Figure 5:
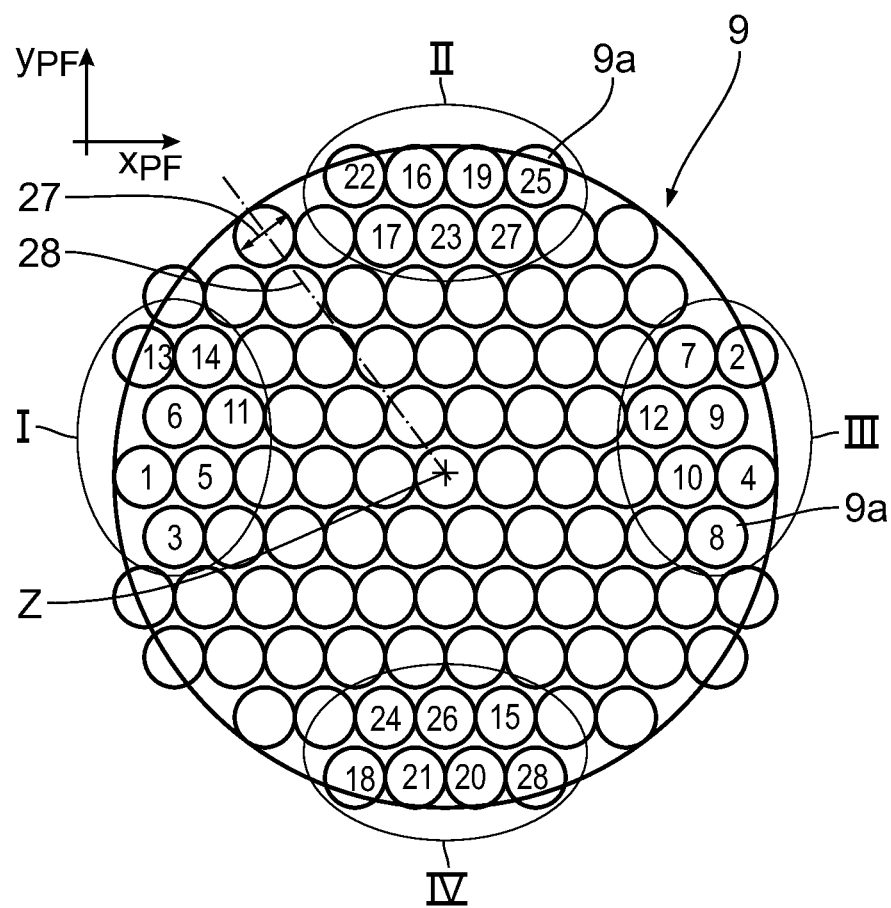

Exemplary embodiments of the invention will be explained in more detail below on the basis of the drawing. In this:

FIG. 1 schematically shows, with reference to an illumination optical unit, an EUV projection lithographic projection exposure apparatus in a meridional section;

FIG. 2 schematically shows, with reference to a field facet mirror, a plan view of several components of an illumination system of the projection exposure apparatus according to FIG. 1, with a scanning device for deflecting an EUV output beam of an EUV light source;

FIG. 3 likewise schematically shows the illustration of a scanning profile for the output beam;

FIG. 4 shows a plan view of a pupil facet mirror of the illumination optical unit, wherein numbers illustrate a sequence of illumination of pupil facets during a scanning procedure of the scanning device; and FIG. 5 shows, in an illustration similar to FIG. 4, a variant of a sequence of the pupil facet illumination during a scanning procedure of the scanning device.

A microlithographic projection exposure apparatus 1 serves for producing a micro- and/or nanostructured electronic semiconductor component. A light and/or radiation source 2 emits EUV radiation in the wavelength range of, for example, between 5 nm and 30 nm. The light source 2 is embodied as free electron laser (FEL). Here, this is a synchrotron radiation source, which generates coherent radiation with very high spectral brightness. Prior publications which describe such FELs are specified in WO 2009/121 438 A1. A light source 2, which can, for example, be employed, is described in Uwe Schindler "Ein supraleitender Undulator mit elektrisch umschaltbarer Helizität" [A superconducting undulator with electrically switchable helicity], Forschungszentrum Karlsruhe in der Helmholtz-Gemeinschaft, wissenschaftliche Berichte, FZKA 6997, August 2004, and in DE 103 58 225 B3.

The light source 2 has a mean power of 2.5 kW. The pulse frequency of the light source 2 is 30 MHz. Each individual radiation pulse then carries an energy of 83 µJ. In the case of a radiation pulse length of 100 fs, this corresponds to a radiation pulse power of 833 MW.

For illumination and imaging purposes within the projection exposure apparatus 1, a used radiation beam 3, which is also referred to as output beam, is employed as illumination light. The used radiation beam 3 is illuminated outward within an aperture angle 4, which is matched to an illumination optical unit 5 of the projection exposure apparatus 1, with the aid of a scanning device 6 still to be explained below. Proceeding from the light source 2, the used radiation beam 3 has a divergence which is less than 5 mrad. The scanning device 6 is arranged in an intermediate focus plane 6a of the illumination optical unit 5. After the scanning device 6, the used radiation beam 3 initially impinges on a field facet mirror 7. Details in respect of the scanning device 6 will still be explained below on the basis of FIGS. 2 and 3.

The used radiation beam 3 more particularly has a divergence which is less than 2 mrad and preferably less than 1 mrad. The spot size of the used radiation beam on the field facet mirror 7 is approximately 4 mm.

FIG. 2 shows, in an exemplary fashion, a facet arrangement, a field facet array, of field facets 8 of the field facet mirror 7. Illustrated in an exemplary fashion are only some of the actually present field facets 8 in three columns and 15 lines. The field facet array of the field facet mirror 7 overall has 6 columns and 75 lines. The field facets 8 have a rectangular shape. Other shapes of the field facets 8 are also possible, for example an arcuate-shaped or an annular-shaped or a sub-ring-shaped geometry. In total, the field facet mirror 7 therefore has 450 field facets 8 in one possible variant. Each field facet 8 has an extent of 50 mm in the horizontal direction in FIG. 2 and 4 mm in the vertical direction in FIG. 2. The whole field facet array accordingly has an extent of 300 mm×300 mm. The field facets 8 are not illustrated true to scale in FIG. 2.

After reflection on the field facet mirror 7, the used radiation beam 3, which has been subdivided into pencils of rays which are associated with the individual field facets 8, impinges on a pupil facet mirror 9. Pupil facets 9*a* (cf. FIGS. 4 and 5), not illustrated in FIG. 1, of the pupil facet mirror 9 are round. Each pencil of rays, reflected by one of the field facets 8, of the used radiation beam 3 is associated with one of these pupil facets 9*a*, and so an impinged upon facet pair with one of the field facets 8 and one of the pupil facets 9*a* respectively predefines an illumination channel or beam guiding channel for the associated pencil of rays of the used radiation beam 3. The channel-by-channel association of the pupil facets 9*a* with the field facets 8 occurs in a manner dependent upon a desired illumination by the projection exposure apparatus 1. Hence, in order to prescribe individual illumination angles along the illumination channel, the output beam 3 is, in sequence, guided over pairs of respectively one of the field facets 8 and respectively one of the pupil facets 9*a*. In order to actuate respectively prescribed pupil facets 9*a*, the field facet mirrors 8 are respectively tilted individually.

Via the pupil facet mirror 9 and a subsequent transmission optical unit 13, which consists of three EUV mirrors 10, 11, 12, the field facets 8 are imaged into an illumination or object field 14 in a reticle or object plane 15 of a projection optical unit 16 of the projection exposure apparatus 1. The EUV mirror 12 is embodied as a grazing incidence mirror.

From the sequence of individual illumination angles, which are prescribed by an individual facet pair 8, 9*a*, an illumination angular distribution of the illumination of the object field 14, which is brought about by the illumination optical unit, emerges via scanning integration of all illumination channels, which is brought about by illuminating the facets 8 of the field facet mirror 7 with the aid of the scanning device 6.

In one embodiment of the illumination optical unit 5 (not illustrated), particularly in the case of a suitable position of an entry pupil of the projection optical unit 16, it is also possible to dispense with mirrors 10, 11 and 12, leading to a corresponding increase in transmission of the projection exposure apparatus for the used radiation beam 3.

Per complete scan of the field facet mirror 7, an overall dose of 49.2 J arrives at the whole object field 14. This overall dose still has to be multiplied by the overall transmission of, firstly, the illumination optical unit 5 and, secondly, the projection optical unit 16.

A reticle 16*a*, which reflects the used radiation beam 3, is arranged in the object plane 15 in the region of the object field 14. The reticle 16*a* is carried by a reticle holder 16*b*, which can be displaced in an actuated manner via a reticle displacement drive 16*c*.

The projection optical unit 16 images the object field 14 into an image field 17 in an image plane 18. During the projection exposure, a wafer 18*a*, which carries a light-sensitive layer that is exposed during the projection exposure by the projection exposure apparatus 1, is arranged in this image plane 18. The wafer 18*a* is carried by a wafer holder 18*b*, which in turn can be displaced in a controlled manner by a wafer displacement drive 18*c*.

In order to simplify the representation of positional relationships, an xyz-coordinate system is used below. The x-axis is perpendicular to the plane of the drawing of FIG. 1 and points into the latter. The y-axis extends to the right in FIG. 1. In FIG. 1, the z-axis extends downward.

During the projection exposure, both the reticle and the wafer are scanned in synchronized fashion in the y-direction in FIG. 1 by an appropriate actuation of the reticle displacement drive 16*c* and the wafer displacement drive 18*c*. During the projection exposure, the wafer is scanned with a typical scanning speed of 600 mm/s in the y-direction. The synchronized scanning of the two displacement drives 16*c* can take place independently of the scanning operation of the scanning device 6.

The long side of the field facets 8 is perpendicular to a scanning direction y. The x/y-aspect ratio of the field facets 8 corresponds to that of the slit-shaped object field 14, which can likewise have a rectangular or arcuate embodiment.

FIGS. 2 and 3 show the scanning device 6 for the used radiation beam 3 in more detail. In order to simplify the representation of positional relationships, an x'-y' coordinate system is used for the scanning device in FIGS. 2 and 3. The x'-axis, which is parallel to the x-axis, extends into the plane of the drawing in FIG. 2 and upward in FIG. 3. The y'-axis, which lies in the yz-plane, extends obliquely to the top-right in FIG. 2 and to the right in FIG. 3.

In order to represent positional relationships with respect to the field facet mirror 7, an $x_{FF}$-$y_{FF}$ coordinate system is used accordingly. The $x_{FF}$-axis extends parallel to the x-axis, i.e. in the direction of the longer sides of the rectangular field facets 8. The $y_{FF}$-direction extends perpendicular thereto in the direction of the shorter sides of the rectangular field facets 8. In FIG. 3, the field facets 8 are illustrated schematically in a square fashion.

Accordingly, in order to represent positional relationships with respect to the pupil facet mirror 9, an $x_{PF}$-$y_{PF}$ coordinate system is used below. In FIGS. 4 and 5, the $x_{PF}$-axis extends to the right. In FIGS. 4 and 5, the $y_{PF}$-axis extends upward.

The scanning device 6 is a scanning mirror, which reflects the used radiation beam 3 in a grazing manner and can be tilted about a line scanning axis 19, which coincides with the y'-axis, and a line feed axis 20, which is parallel to the x'-axis. Both axes 19, 20 lie in a reflecting mirror surface 21 of the scanning device 6.

In FIG. 3, the field facet mirror 7 is schematically illustrated as a 4×4 array with four horizontal lines with respectively four field facets 8. The following frequency and time data relate to the illumination of the field facet mirror 7 with the 6×75 array, which has already been explained in conjunction with FIG. 2. The tilting about the line scanning axis 19 for scanning a field facet line along the $x_{FF}$-direction takes place with a line frequency of 7.5 kHz in the described embodiment. Here, the mirror surface 21 is tilted by +/−4.5°, leading to a deflection angle for the used radiation beam 3 of +/−9°. Accordingly, the dwell time of the used radiation beam 3 on respectively one line ($y_{FF}$=constant) of the field facet mirror 7 is 133.3 μs. The line feed in the $y_{FF}$-direction is brought about by synchronized tilting about the line feed axis 20 such that the 75 lines are scanned with the correct line distance, wherein the tilt about the line feed axis 20 also ensures a return of the used radiation beam 3 from the last scanned field facet 8*z* back to the first field facet 8*a* to be scanned. The mirror surface 21 is therefore additionally tilted about the line feed axis 20 with a frequency of 100 Hz. The dwell time per individual field facet 8 is 22.2 μs. Thus, during the dwell time on a field facet 8, 660 EUV radiation pulses impinge on the field facet 8.

A higher line frequency than the above-described line frequency of 7.5 kHz is also possible, for example a line frequency of 10 kHz, 15 kHz, 20 kHz or even an even higher line frequency.

The distance between the mirror surface 21 and the field facet mirror 7 is approximately 1 m.

Instead of a tilt about the line feed axis 20, the line feed can also be generated with the aid of a polygon scanner, which rotates about the line feed axis 20. For the mirror tilt variation by +/−4.5°, this polygon scanner has a total of 40 polygon facets, i.e. it is formed as a regular tetracontagon in the circumferential direction about its axis of rotation. A line frequency of 7.5 kHz is achieved by a rotational frequency of the polygon scanner of 187.5 Hz. In the embodiment of the scanning device 6 with the polygon mirror (not illustrated), a tilt mirror is arranged up- or downstream thereof, which tilt mirror, as described above, can be tilted about the line feed axis 20.

The image field 17 has a slit width of 2 mm parallel to the scanning direction y and a slit breadth of 26 mm perpendicular to the scanning direction, i.e. in the x-direction. In the case of an assumed dose on the wafer 18a of 30 mJ/cm$^2$, which ensures that the light-sensitive layer reacts, a scanning speed of 600 mm/s at the reticle 16a and an image field breadth of 26 mm, the output beam 3 must arrive at the wafer 18a with a power of 5 W.

A line feed, i.e. a change between the various lines of the field facet mirror 7, can alternatively also be achieved by reflection at a facet mirror 22 displaced parallel to the columns of the field facet mirror 7, which facet mirror is illustrated bottom right in FIG. 3. The displacement direction of the facet mirror 22 is parallel to the $y_{FF}$-direction. Depending on the point at which the used radiation beam 3 impinges on one of the facets 23 of the facet mirror 22, the used radiation beam 3 is guided into a different line of the field facet mirror 7. FIG. 3 illustrates a facet mirror 22 with five facets 23. This illustration simplifies matters. In order to illuminate the facet mirror 7 according to FIG. 2, a facet mirror 22 with 75 facets is required. This faceting into 75 facets can then also be combined with faceting in the circumferential direction about the line feed axis 19 such that the facet mirror 22 receives the form of a faceted convex body, in particular a faceted sphere. In the case of sufficiently small used radiation beams 3, the facet mirror 22 can also be designed with a continuous contour instead of the faceting, with continuous transitions and no sharp edges being present between the facet surfaces. The planar sections between these soft transitions have the same normal vectors as in the embodiment with the sharp edges.

In a further variant of the projection exposure apparatus 1, the light source 2 is equipped with an intensity modulator 24 for modulating the intensity of the used radiation beam 3. For synchronization purposes, the intensity modulator 24 is signal connected to the scanning device 6. The intensity modulator 24 can be operated in such a way that the used radiation beam 3 is influenced in terms of its intensity when sweeping over an individual field facet 8 of a field facet mirror, for example the field facet mirror 7. If this influence is brought about in the same fashion at all swept-over field facets 8 of the field facet mirror 7, this results in a corresponding influence of the intensity distribution of the illumination in the object field 14.

Alternatively, or in addition thereto, the intensity modulation by the intensity modulator 24 can be synchronized with the scanning device 6 in such a way that the used radiation beam 3 is influenced in terms of its intensity in a manner synchronized to sweeping over a pupil facet mirror. This can achieve a correction of the illumination angular distribution over the object field 14.

An effect corresponding to the intensity modulation by the intensity modulator 24 can also be obtained by varying the deflection speed of the deflection of the used radiation beam 3 when sweeping over the field facet mirror 7. By way of example, if the field facet mirror 7 is scanned with varying deflection speed in such a way that the center of each field facet 8 is swept over more quickly than the two edges at the right-hand and at the left-hand edge of the field facet 8, this results in the object field 14 being impinged upon by the used radiation beam 3, wherein the center is less strongly impinged upon compared to the edge.

The EUV light source 2 has an electron beam supply device 2a for generating an electron beam 2b, and an EUV generating device 2c. The latter is supplied with the electron beam 2b by the electron beam supply device 2a. The EUV generating device 2c is embodied as an undulator.

The EUV light source 2 furthermore has a polarization setting device 25, which, for setting the polarization of the output beam 3, exerts an adjustable deflecting effect on the electron beam 2b in the EUV generating device 2c. Here, the polarization setting device 25 is embodied in such a way that it influences the effect of deflection magnets 26 of the undulator 2c on the electron beam 2b passing through the undulator 2c. Some of these deflection magnets 26 as components of the undulator 2c are indicated schematically in FIG. 1.

A polarization state of the output beam 3, set by the polarization setting device 25, can be linearly, elliptically or circularly polarized. Mixed forms of these polarization states are also possible.

The deflection magnets 26 are embodied as electromagnets. The polarization setting device 25 controls a current intensity of a current flow through the deflection magnets 26.

The actuation of the current flow enables a change in the polarization state between the linear, elliptic and circular polarization states, for example a change in the polarization of the output beam 3 between a linearly horizontal polarization, e.g. parallel to the x-direction, and a linearly vertical polarization, e.g. parallel to the y-direction, with the output beam 3 in this case propagating along the z-direction.

Examples for actuating a current flow by deflection magnets of an undulator for setting corresponding polarization states of the output beam 3 are provided in Uwe Schindler "Ein supraleitender Undulator mit elektrisch umschaltbarer Helizität" [A superconducting undulator with electrically switchable helicity], Forschungszentrum Karlsruhe in der Helmholtz-Gemeinschaft, wissenschaftliche Berichte, FZKA 6997, August 2004, and in DE 103 58 225 B3.

The polarization state of the used light can be changed between impinging upon a first field facet, for example the field facet 8a in FIG. 3, and, after a corresponding scanning deflection, impinging upon a further field facet, for example the field facet 8b in FIG. 3. Here, for example, a change between a linear x-polarization and a linear y-polarization is possible. A different change between arbitrary pairs of polarization states "linearly polarized in direction a", "linearly polarized in direction b", "circularly polarized" and "elliptically polarized with major axis ratio c/d" is also possible.

When operating the illumination system with the EUV light source 2 and the illumination optical unit 5, it is possible to set a tilt angle association of the field facets 8 of the field facet mirror 7 and the pupil facet 9a of the pupil facet mirror 9 in such a way that respectively one of the pupil facets 9a is associated with the field facets 8 of a group of field facets 8 to be impinged upon by the output beam 3, for example all field facets 8 of the field facet mirror 7, via an illumination channel. The scanning device 6, the polarization setting device 25 and the tilt angle association are then matched to one another in such a way that the output beam 3 on each of the pupil facets 9a has a predetermined polarization state.

This matching process will be explained in more detail below on the basis of the "quadrupole-illumination setting" example on the basis of FIG. 4. What is illustrated is a tilt angle association between the field facets of the field facet mirror (not illustrated) and the pupil facets 9a of the pupil facet mirror 9 such that, during the scanning of the field facets 8 by the scanning device 6, this results in a sequence of the output beam impinging upon the pupil facets 9a which is specified in FIG. 4 by numbering the pupil facets 9a. Here, the polarization setting device 25 switches the polarization state of the output beam 3 in a manner synchronized with the scanning device 6 in such a way that the four poles I to IV of the quadrupole illumination setting are respectively impinged upon by illumination light 3 with a uniform polarization state.

Here, poles I to IV form contiguous regions of several pupil facets 9a.

Poles I and III can be impinged upon by illumination light 3 which is polarized along the $y_{PF}$-direction. Poles II and IV by contrast can be impinged upon by illumination light 3 which is linearly polarized perpendicular thereto, i.e. along the $x_{PF}$-direction.

Naturally, other polarization associations, in a manner corresponding to the synchronization between the scanning device 6 and the polarization device 25 at a given tilt association, are also possible.

By way of example, impingement of the pupil facet mirror 9 is possible, in which an annular region of the pupil facets 9a is impinged upon by the illumination light 3 around a center Z of the pupil facet mirror 9 in such a way that the polarization state of the output beam 3 on each of the impinged upon pupil facets 9a has a linear polarization component 27 (cf. FIG. 4), which is perpendicular to a connecting line 28 between the pupil facet 9a and the center Z of the arrangement of the pupil facets 9a on the pupil facet mirror 9.

If this relationship of the direction of the linear polarization is satisfied for all pupil facets 9a of the annular illumination of the pupil facet mirror 9, this results in an annular illumination setting with tangential polarization. In the case of an annular illumination, it is alternatively also possible for an elliptical polarization to be realized with a main polarization main direction perpendicular to the respective connecting lines 28.

The polarization states for those beam components of the output beam 3 which are respectively associated with one of the illumination channels can also be prescribed in such a way that these beam components contain a polarization lead, which takes account of subsequent influencing of the polarization along the path of the output beam 3, in particular after the pupil facet mirror 9. Here, it is possible, for example, to take account of a geometric polarization rotation of the polarization of the output beam 3 on its path to the object field 14.

A sequential impingement of the pupil facets 9a of the pupil facet mirror 9 will be explained below on the basis of FIG. 5, during which sequential impingement a number of switching procedures of the polarization setting device 25 are reduced compared to the impingement according to FIG. 4. The same quadrupole illumination setting which is linearly polarized in regions should be prescribed by the impingement sequence according to FIG. 5 as with the impingement sequence according to FIG. 4. In contrast to the impingement according to FIG. 4, the impingement sequence according to FIG. 5 is designed in such a way that, initially, the pupil facets 9a which are present in poles I and III are impinged upon and, subsequently, the pupil facets 9a which are present in poles II and IV are impinged upon. Since the pupil facets 9a in poles I and III on the one hand and in poles II and IV on the other hand are impinged upon by used light linearly polarized in the same direction, a single switching procedure of the polarization setting device 25 suffices during the impingement sequence according to FIG. 5, namely between the pupil facets 9a which are impinged upon by the output beam 3 at the 14th and at the 15th position in the sequence. Between these two pupil facets 9a there is switching of a polarization of the output beam 3 in the $y_{PF}$-direction into a polarization in the $x_{PF}$-direction.

Thus, in the sequence according to FIG. 5, several pupil facets 9a are impinged upon sequentially on the pupil facet mirror 9, between which pupil facets there is no difference prescribed in the polarization state.

When producing a micro- or nanostructured component using the projection exposure apparatus 1, provision is initially made for the reticle 16a and the wafer 18a. A structure on the reticle 16a is subsequently projected onto a light-sensitive layer of the wafer 18a with the aid of the projection exposure apparatus 1. By developing the light-sensitive layer, a micro- or nanostructure is produced on the wafer 18a and hence the micro- or nanostructured component is produced, for example a semiconductor component in the form of a memory chip.

The invention claimed is:

1. An illumination system, comprising:
    a free electron laser configured to generate an EUV radiation beam, the free electron laser comprising:
        a first device configured to generate an electron beam;
        a second device configured to interact with the electron beam to generate EUV radiation; and
        a third device configured to exert an adjustable deflecting effect on the electron beam to set a polarization of the EUV radiation beam;
    a scanning device configured to deflect the EUV radiation beam; and
    an illumination optical unit configured to guide the EUV radiation beam along an optical axis to an illumination field,
    wherein the scanning device is configured to: a) operate in a synchronized fashion with the third device; and b) match an aperture angle of the EUV radiation beam to the illumination optical unit.

2. The illumination system of claim 1, wherein the second device comprises an undulator comprising deflection magnets, and the third device is configured to influence an effect of the deflection magnets on the electron beam.

3. The illumination system of claim 1, wherein the second device comprises an undulator comprising deflection electromagnets, and the third device is configured to control an intensity of a current flow through the electromagnets.

4. The illumination system of claim 1, wherein the illumination optical unit comprises:
    a field facet mirror comprising a plurality of field facet; and
    a pupil facet mirror comprising a plurality of pupil facets, wherein:

the field and pupil facet mirrors are configured so that, during use of the illumination system, an illumination channel of EUV radiation is present between a field facet of a group of field facets and a pupil facet; and the scanning device and the third device are associated by a tilt angle which is matched so that the EUV radiation beam has a predetermined polarization state on each of the pupil facets.

5. The illumination system of claim 4, wherein the scanning device and the second device are associated by a tilt angle so that the polarization state of the EUV radiation beam on each of the pupil facets has a linear polarization component which is perpendicular on a connecting line from the pupil facet to a center of an arrangement of the pupil facets on the pupil facet mirror.

6. The illumination system of claim 4, wherein the polarization state on the impinged upon pupil facets contains a polarization lead which takes account of subsequent influencing of the polarization along the path of the EUV radiation beam after the pupil facet mirror.

7. The illumination system of claim 4 wherein the matching is such that a plurality of pupil facets, between which no difference in the polarization state is prescribed, are impinged upon in sequence on the pupil facet mirror.

8. An optical system, comprising:
an illumination system according to claim 1; and
a projection optical unit configured to image the illumination field into an image field.

9. An apparatus, comprising:
an illumination system according to claim 1; and
a projection optical unit configured to image the illumination field into an image field;
a first object holder configured to hold an object in the illumination plane; and
a second object holder configured to hold a second object in an image plane which contains the image field,
wherein the apparatus is an EUV lithographic projection exposure apparatus.

10. A method of operating an EUV lithographic projection exposure apparatus which comprises an illumination system and a projection optical unit, the method comprising:

using the illumination system to illuminate a reticle in an illumination field of the illumination system; and
using projection optical unit to image at least a portion of the illuminated reticle onto a light-sensitive material in an image field of the projection optical unit,
wherein the illumination system is an illumination system according to claim 1.

11. The illumination system of claim 1, wherein:
the second device comprises an undulator comprising deflection electromagnets;
the third device is configured so that, during use of the illumination system, the third device controls an intensity of a current flow through the deflection electromagnets to adjust a deflecting effect of the second device on the electron beam to set a polarization of the EUV radiation beam.

12. The illumination system of claim 1, wherein:
the second device comprises an undulator comprising deflection magnets; and
the third device is configured so that, during use of the illumination system, the third device influences the deflection magnets to influence a deflecting effect of the deflection magnets on the electron beam.

13. An illumination system, comprising:
a free electron laser configured to generate an EUV radiation beam, the free electron laser comprising:
a first device configured to generate an electron beam;
a second device configured to interact with the electron beam to generate EUV radiation; and
a third device configured to exert an adjustable deflecting effect on the electron beam to set a polarization of the EUV radiation beam;
a scanning device configured to deflect the EUV radiation beam; and
an illumination optical unit configured to guide the EUV radiation beam along an optical axis to an illumination field,
wherein the scanning device is configured to operate in a synchronized fashion with the third device, and the scanning device is arranged in an intermediate focus plane of the illumination optical unit.

* * * * *